United States Patent [19]

Myers et al.

[11] Patent Number: 5,395,679
[45] Date of Patent: Mar. 7, 1995

[54] ULTRA-THICK THICK FILMS FOR THERMAL MANAGEMENT AND CURRENT CARRYING CAPABILITIES IN HYBRID CIRCUITS

[75] Inventors: Bruce A. Myers; Dwadasi H. R. Sarma; Anil K. Kollipara, all of Kokomo, Ind.; Ponnusamy Palanisamy, Lansdale, Pa.

[73] Assignee: Delco Electronics Corp., Kokomo, Ind.

[21] Appl. No.: 38,379

[22] Filed: Mar. 29, 1993

[51] Int. Cl.⁶ ............................................. B32B 9/00
[52] U.S. Cl. .................................. 428/209; 428/901; 361/706; 361/774
[58] Field of Search ................ 361/387, 406; 428/209, 428/901

[56] References Cited

U.S. PATENT DOCUMENTS

| | | | |
|---|---|---|---|
| 4,612,601 | 9/1986 | Watari | 361/387 |
| 5,121,298 | 6/1992 | Sarma et al. | 361/406 |
| 5,173,839 | 12/1992 | Metz, Jr. | 361/387 |

FOREIGN PATENT DOCUMENTS

0434264A2  6/1990  European Pat. Off.

OTHER PUBLICATIONS

449–F&M Feinwerktechnik & Messtechnik 98 (1990) Nov., No. 11, Munchen, DE.

*Primary Examiner*—Patrick J. Ryan
*Assistant Examiner*—Kam Lee
*Attorney, Agent, or Firm*—Cary W. Brooks; Mark A. Navarre

[57] ABSTRACT

Disclosed is an ultra-thick thick film of copper or silver or other suitable conductor material for use in spreading heat laterally, i.e., in the x and y directions, along a substrate. A substrate of suitable thickness is chosen to dissipate heat in the vertical or z-direction underneath a heat generating component such as a semiconductor chip. The ultra-thick films have a thickness ranging from about 2 to about 5 mils and are prepared from metal powders having average particles sizes ranging from about 1 micron to 3 microns.

13 Claims, 2 Drawing Sheets

ULTRA-THICK THICK FILMS FOR THERMAL MANAGEMENT AND CURRENT CARRYING CAPABILITIES IN HYBRID CIRCUITS

FIELD OF THE INVENTION

This invention relates to thick films, and particularly to ultra-thick thick films used for heat spreading and high current conduction.

BACKGROUND OF THE INVENTION

A variety of methods are known for dissipating heat in semiconductor devices. An existing method of heat dissipation employs a beryllium oxide (BeO) substrate which has a very high thermal conductivity. In addition, electrical currents may also be conducted by a refractory metallization and solder on the BeO substrate. Disadvantages of such systems include relatively high cost of manufacture, the toxic nature of BeO and relatively high electrical resistance of the refractory metallization. In fact, the use of BeO may not be practical in near future due to anticipated environmental regulation.

Many thermal management methods for semiconductor applications are designed to dissipate heat primarily in the vertical or z-direction underneath the heat generating device. For example, alumina substrates are often placed underneath the heat generating semiconductor chips. The alumina substrates dissipate heat in the vertical or z-direction away from the heat generating chip. Such designs are limited in their ability to dissipate heat laterally, i.e., in the x and y directions. This is because the thermal conductivity of an alumina substrate is low compared to metallic materials and the cross-sectional area of the substrate (thickness) available for conduction in the lateral direction is smaller than the area under the chip for thermal conduction in the z-direction. Systems capable of dissipating heat also in the lateral direction, i.e., x and y directions, have an advantage over systems capable of dissipating heat only in the vertical or z-direction. Dissipation of heat in the x and y directions is an advantage because it provides low thermal resistance paths in addition to the path directly under the heat dissipating device which results in an overall reduction of the device's thermal resistance.

Many semiconductor heat dissipating systems primarily use a large substrate or metal core for dissipating heat. The use of thick films for dissipating heat has not heretofore been seriously considered. Conventional thick films have a thickness in the range of about 0.5 mil to 1.0 mil. It is conventional wisdom to optimize the thickness of such films in the 0.5 mil to 1.0 mil for the intended application. Thicker films are considered to be disadvantageous especially in the cases of nitrogen-fireable copper conductor films where the excessive thickness can lead to improper binder burn-out and can have detrimental effects on solderability and/or adhesion strength. However, it would be desirable to develop a heat dissipating and current conduction system utilizing thick films which is capable of spreading heat in the lateral direction (i.e., in the x and y directions).

SUMMARY OF THE INVENTION

In general, the present invention employs ultra-thick thick films (UTTF) of copper or silver or other suitable electrical conductor material to spread heat laterally, in the x and y directions, underneath a heat generating semiconductor device and along the surface of an underlying substrate. The substrate has a thickness suitably chosen to dissipate heat in the z-direction or vertical direction. The UTTFs provide for a larger cross-sectional area for lateral heat spreading than do conventional metallizations. The UTTFs also provide a low electrical resistance path for high transient currents up to 75 amperes and steady state currents of up to 35 amperes on ceramic substrates. This is achieved with the thick film material and as such eliminates special discrete power busses, high cost metal core substrate materials, or high cost metallization techniques. The combination of high thermal conductivity and electrical conductivity substantially enhances the capability of alumina-based thick-film circuits for use in high power applications. The UTTFs have thicknesses ranging from greater than 0.001" to about 0.005".

The UTTFs may be prepared by using single or multiple layers of printed films. In the case of multiple printed layers, it is preferable to use a first layer of a high-adhesion composition, and a top layer of a high-solderability composition. The high-adhesion composition includes inorganic binders, and the high-solderability composition contains little or no inorganic binders. For multi-layer UTTFs, it is preferred to fire each layer separately in order to effect complete removal of organics.

These and other objects, features and advantages will become apparent from the following brief description of the drawings, detailed description, appended claims and drawings.

DETAILED DESCRIPTION OF THE INVENTION

Figure 1:
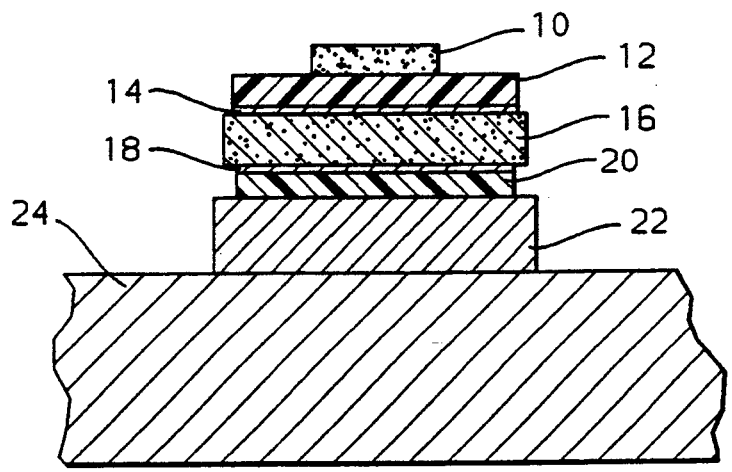
FIG. 1 is an illustration of a prior art semiconductor device.

FIG. 1 shows a prior art semiconductor device having a heat dissipating system. The prior art device includes a high power device 10 such as a semiconductor chip which dissipates heat. Directly underneath the high power device is a first layer 12 of Sn/Pb in a weight ratio of 25/75 respectively. Below the first layer of Sn/Pb is a first metallization layer 14 of Mo/Mn. Under the first metallization layer is a layer of beryllia (BeO) 16. A second metallization layer 18 of Mo/Mn is directly underneath the layer of beryllia. Below the second metallization layer is a second layer 20 of Sn/Pb in a weight ratio of 60/40 respectively. Under the second layer of Sn/Pb is a copper buffer 22. Finally, an aluminum backplate 24 is directly underneath the copper buffer. The characteristics of this device are such that heat is dissipated substantially only in the vertical or z-direction underneath the high power source device. This system does not dissipate heat in the lateral, i.e., x and y directions, to any considerable degree. This drawback is overcome by the present invention.

Figure 2:
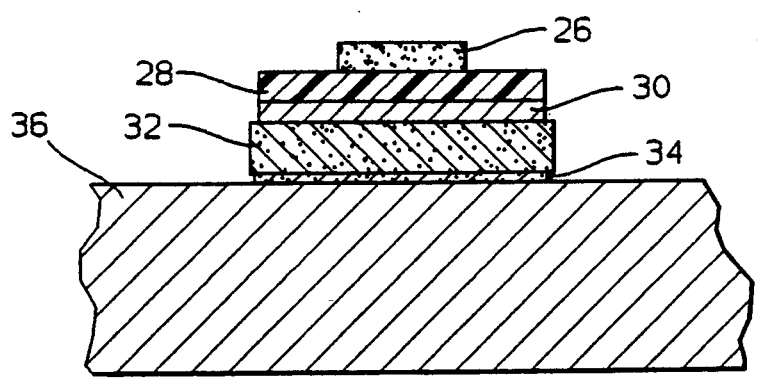
FIG. 2 is an illustration of one embodiment of the present invention wherein a UTTF is interposed between a high power device and a heat dissipating substrate.

One embodiment of the present invention is illustrated in FIG. 2. The embodiment includes a high power device 26 such as a semiconductor chip which dissipates heat. Directly underneath the high power device is a Sn/Pb layer 28 in a weight ratio of 25/75 respectively. A UTTF 30 according to the present invention is placed under the Sn/Pb layer. Below the UTTF is an alumina layer 32. A thermally conductive adhesive 34 is positioned under the alumina layer. Beneath the adhesive is an aluminum backplate. In this embodiment the Sn/Pb film typically has a thickness ranging from about 0.001" to about 0.007". A suitable composition for forming the Sn/Pb film is manufactured by Delco Electronics. Similar compositions are commercially available. The alumina layer is 96% aluminum oxide (the remaining portion (4%) is a binder agent) available from Coors Ceramics Company. The alumina layer may have a thickness ranging from about 0.010" to about 0.035", and preferably 0.015" or 0.035". The thickness of the alumina layer is chosen to optimize mechanical and electrical isolation with good thermal performance.

The thermally conductive adhesive includes a silicone resin. A suitable adhesive is available from Dow Corning Company under the trade name DC 6843 or DC 6325. The adhesive may be applied in a thickness ranging from about 0.002" to about 0.007", and preferably 0.005". This thickness of the adhesive is chosen so that the adhesive serves a function of mechanical attachment, TCE stress relief between the alumina substrate and the aluminum backplate, and minimum resistance to heat transfer. The aluminum backplate typically has a thickness ranging from about 0.05" to about 0.25".

The UTTF, as illustrated in FIG. 2, is formed from a composition including a metal powder of copper or silver or other conductive material. The amount of metal powder present in the composition may range from about 80 to about 90 weight percent. Copper UTTFs are prepared from a composition including copper powder having a particle size ranging from about 1 micron to about 3 microns, and preferably 1 micron to about 2 microns. The composition includes about 81 percent of copper powder, about 7 percent inorganic binder, the rest being a screening agent. Suitable copper powders are available from Grezes, Inc., Berwyn, PA under the trade name Cu III. Suitable silver inks are available from DuPont Electronics, Wilmington, Del. under the trade name DuPont 6160. Preferably the composition used to form the UTTF film includes an inorganic oxide binder present in an amount ranging from about 6.0 to about 7.0 weight percent. Suitable oxide binders are bismuth oxide and copper oxide powders. The UTTF compositions are formulated using conventional techniques known to those skilled in the art.

Preferably, the UTTF is formed by multiple printings of UTTF compositions. The films may be printed using a stencil printing technique. Stencil printing is a process where a brass plate of a suitable thickness is used along with a wire mesh screen. The stencil is used in place of an emulsion coating on the screen. The UTTF is formed to a thickness ranging from about 1 mil to about 5 mils, preferably about 2 mils to about 4 mils.

The copper UTTFs are fired in a nitrogen atmosphere at a temperature ranging from about 900° C., to about 925° C., and preferably a peak temperature of about 900° C. The silver UTTFs are fired in air at a temperature ranging from about 825° C. to about 875° C., and preferably a peak temperature of 850° C.

In a preferred embodiment, the UTTF is formed by a bottom layer of a high-adhesion composition formed on an alumina substrate. A high-adhesion composition comprises 81.3% copper powder, 6.8% inorganic binders, and about 12% screening agent by weight. The thickness of the high-adhesion layer may range from about 0.0005" to about 0.003", and preferably about 0.002" thick. A top UTTF layer of high-solderability composition is formed over the bottom UTTF layer. A high-solderability composition comprises 91.8% copper powder and 8.2% screening agent by weight and no oxide binder. The specific screening agent is a mixture of about 90 percent by weight of a solvent, typically TEXANOL ™ (believed to be 2,2,4 Trimethyl 1,3 Pentanedio Monoisobutyrate), and the remainder of a resin, typically ethyl cellulose grade N-50, both of which are available commercially. The high-solderability composition layer may have a thickness ranging from about 0.0005" to about 0.003", and preferably about 0.002" thick. The high-adhesion composition and high-solderability composition multi-layer UTTF structure is advantageous for copper UTTF compositions.

Figure 3:
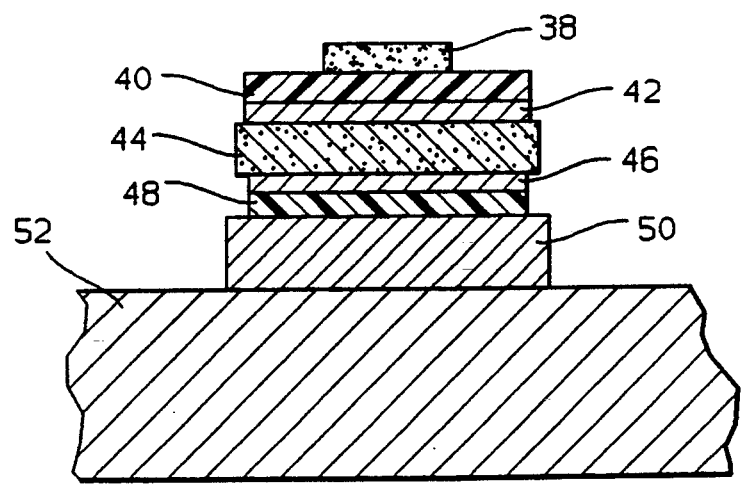
FIG. 3 is an illustration of another embodiment of the present invention wherein UTTFs are interposed at various locations in a system for dissipating heat from a high power device.

FIG. 3 illustrates another embodiment of the present invention. This embodiment includes the following elements placed underneath each other in the following order: a high power device 38 such as an integrated circuit chip which produces heat; a first Sn/Pb layer 40 with a weight ratio of 25/75 respectively a first UTTF layer 42; an alumina layer 44; a second UTTF layer 46; a second Sn/Pb layer 48 with a weight ratio of 60/40 respectively; a copper buffer 50; and an aluminum backplate 52.

FIG. 3 has a construction somewhat similar to that of the prior art device illustrated in FIG. 1. However, the prior art device uses a beryllium oxide layer because of its high thermal conductivity. Ordinarily, an alumina layer used in the present invention (FIG. 3) would be avoided because of its lower thermal conductivity. However, the use of UTTF layers overcomes these disadvantages by lateral spreading of the heat and allowing the vertical dissipation of heat through a larger area of the alumina substrate.

As illustrated in FIG. 3, the length, width and thickness of the UTTF layer is chosen to sufficiently provide substantial heat dissipation in the lateral direction, i.e., x and y directions. For example, for a high power device such as a semiconductor chip having a length and width of about 0.200" and 0.200", respectively, the UTTF may have a thickness of about 0.004", width of about 0.330" and length of about 0.480".

Figure 4:
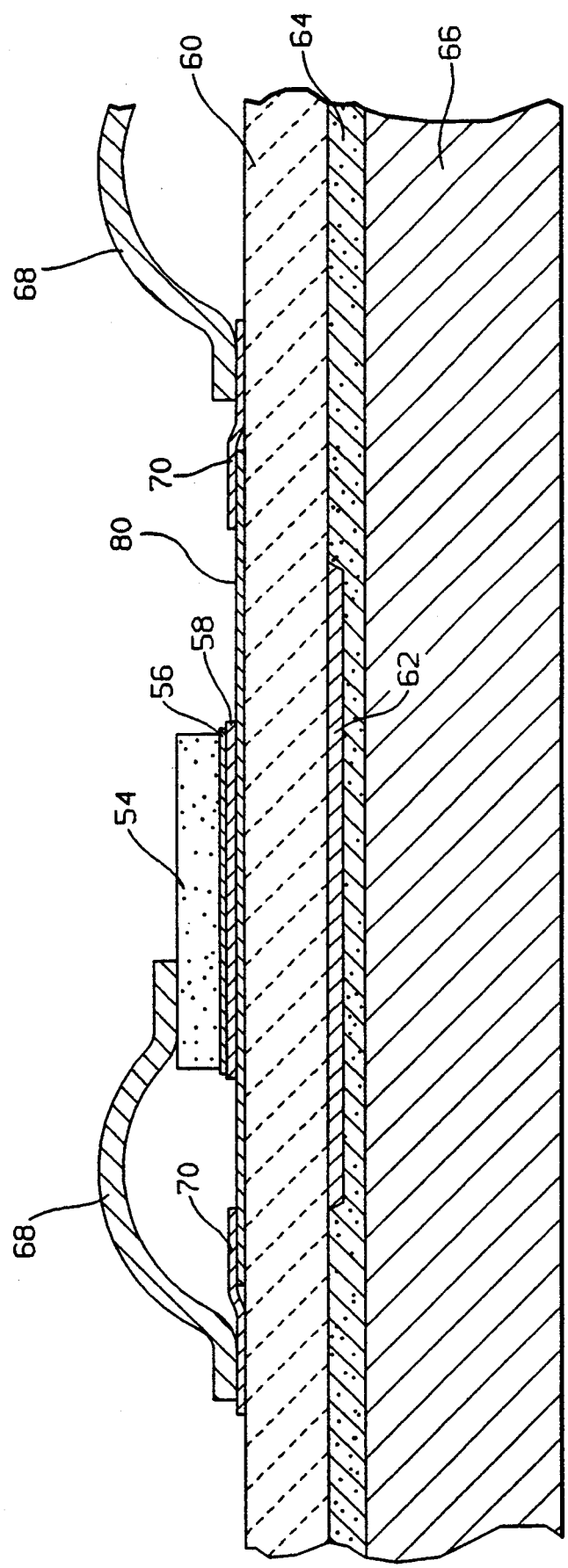
FIG. 4 is an illustration of another embodiment of the present invention wherein UTTFs are utilized at various locations on a high power ceramic circuit utilizing a semiconductor device including underneath bonded wires.

FIG. 4 illustrates another embodiment of the present invention including a semiconductor chip 54, a solder layer 56, a palladium-silver UTTF layer 58 underneath the solder layer, a silver UTTF layer 80, an alumina substrate 60, a silver UTTF layer 62, a thermally conductive silicone adhesive layer 64, and an aluminum housing or backplate 66 arranged similar to the device of FIG. 3. The embodiment further includes an aluminum wire 68 bonded to the chip and to the substrate. A silver-palladium UTTF layer 70 is interposed between the aluminum wire and the substrate at the bonding location. The silver-palladium composition used is available from DuPont Company under the trade name DuPont 7484 and includes silver and palladium in a 3:1 weight ratio. The silver palladium UTTF serves to dissipate heat from the wire and provides a reliable bonding surface. The UTTF layers 58, 80, and 62 provide for lateral thermal conduction prior to heat conduction (in the z-direction) through the relatively lower thermal conductive substrate and adhesive layers. The UTTF layers 58, 80, and 70 also provide a low electrical resistance path for high circuit currents. The UTTF layer 62 also improves the total structural thermal conductivity by thinning the relatively lower thermal conductive adhesive layer in the area below the heat-dissipating device. The UTTF layer 62 under the alumina substrate 60 serves to thin the amount of thermally conductive adhesive 64 between the alumina substrate 60 and the backplate 66, thus improving heat transfer. The remaining portions of the thermally conductive adhesive 64 is relatively thicker, thus providing improved stress relief between the substrate 60 and backplate 66.

The following examples illustrate features and advantages of the present invention.

In examples 1–4, UTTF formulations were prepared with copper powder. UTTFs were formed by single or multiple printing of the UTTF's compositions as indicated in Table I. In each case, after a layer is printed, the film was allowed to dry and then fired after each printing. The multi-layer UTTF structures utilized two different copper UTTF compositions. A first copper composition (BC-12) comprised about 81.2 weight percent of copper powder, about 6.8 weight percent of inorganic binder, and about 12.0 weight percent screening agent. A second copper composition (PC-2) comprised about 91.8 weight percent of copper powder, zero weight percent of inorganic binder, and about 8.2 weight percent screening agent. Table I describes the various UTTFs, sheet resistances and resistivities thereof. The term 80 mesh under "Process Description" refers to the screen mesh used in printing.

TABLE I

| Example | Formulations used | Process Description | Fired Film Thickness (mils) | Sheet Resistance in milliohms/sq | Resistivity of film (Ohm-Cm $\times 10^{-6}$) |
| --- | --- | --- | --- | --- | --- |
| 1 | BC - 12 Copper | 80 mesh, pdf | 2.0 | 0.60 | 3.05 |
| 2 | BC - 12 Copper | 80 mesh, 2 layers pdf, pdf | 4.2 | 0.28 | 2.99 |
| 3 | BC - 12 Copper | 80 mesh, 3 layers pdf, pdf, pdf | 6.3 | 0.16 | 2.56 |
| 4 | BC - 12 Copper & PC - 2 Copper | 80 mesh (BC - 12) bottom layer, 80 mesh, (PC - 2) top layer pdf, pdf | 5.2 | 0.24 | 3.17 |

Wherein pdf indicates the operations printing, drying, and firing; and sheet resistance means resistance of a square form of the conductor and is measured by conventional methods.

The following examples in Tables 2 and 3 illustrate the thermal resistance values achieved using UTTFs according to the present invention. In examples A–G in Table 2, copper UTTFs were prepared using copper powder. The differences in each of examples A–G were the printing technique and the copper ink compositions used. These differences are described in Table 2 wherein "two-mil stencil" means a screen with a 2 mil brass stencil was used, and "four-mil stencil" means a screen with a 4 mil brass stencil was used. In examples F & G, two layers of the UTTF formulations were each printed, dried and fired to achieve the final fired thicknesses.

TABLE 2

| Example | Mesh Size | Fired Thickness | Average Thermal Resistance (°C./Watt) | Std. Dev (°C./Watt) |
| --- | --- | --- | --- | --- |
| A | 230* | — | 2.506 | 0.469 |
| B | 80 | — | 2.360 | 0.146 |
| C | 80 + 2 Mil Stencil | — | 2.297 | 0.164 |
| D | 230 + 230 | — | 2.140 | 0.092 |
| E | 80 + 2 Mil Stencil + 230 | — | 1.993 | 0.160 |
| F | 2 × (80 + 2 Mil Stencil) | — | 1.968 | 0.143 |
| G | 2 × (80 + 4 Mil Stencil) | — | 1.875 | 0.109 |

*Average thickness of 0.5 to 0.7 mils is obtained using a 325 mesh.

Silver UTTFs were prepared using commercially available DuPont 6160. The silver film printing processes are described in examples H–N of Table 3.

It should be noted that silver UTTFs can be made using a high-adhesion (solderable or non-solderable) film on the bottom, and a solderable (high or low adhesion) film on the top. A system that has been used in the laboratory included a silver conductor available at Delco Electronics Corporation as the bottom film, and a DuPont 6160 conductor as the top film. Other similar electrically conductive thick film compositions, such as platinum-silver, may be used for UTTFs.

TABLE 3

| Example | Mesh Size | Fired Thickness | Average Thermal Resistance (°C./Watt) | Std. Dev (°C./Watt) |
| --- | --- | --- | --- | --- |
| H | 230* | — | 2.170 | 0.091 |
| I | 80 | — | 2.088 | 0.156 |
| J | 80 + 2 Mil Stencil | — | 1.949 | 0.145 |
| K | 230 + 230 | — | 2.038 | 0.075 |
| L | 80 + 2 Mil Stencil + 230 | — | 1.926 | 0.109 |
| M | 2 × (80 + 2 Mil Stencil) | — | 1.881 | 0.079 |
| N | 2 × (80 + 4 Mil Stencil) | — | 1.848 | 0.070 |

*Average thickness of 0.5 to 0.7 mils is obtained using a 325 mesh.

The embodiments of the invention in which an exclusive property or privilege is claimed are defined as follows:

1. A microelectronic device having enhanced lateral heat dissipation characteristics, said device comprising:
   an alumina substrate;
   a heat generating component supported by said alumina substrate;

a solder layer underlying said heat generating component; and an ultra-thick thick film having a thickness ranging from about 2 to about 5 mils interposed between said solder layer and said alumina substrate, said ultra-thick thick film being secured to said alumina substrate;

whereby said thickness of said ultra-thick thick film promotes lateral heat dissipation from said heat generating component and to said alumina substrate.

2. A microelectronic device as set forth in claim 1 further comprising a metal backplate and a thermally conductive adhesive, said thermally conductive adhesive being disposed between said backplate and said alumina substrate.

3. A microelectronic device as set forth in claim 1 wherein said ultra-thick thick film comprises a metallic material selected from the group consisting of copper, silver, palladium-silver and platinum-silver.

4. A microelectronic device as set forth in claim 3 wherein said ultra-thick thick film comprises two juxtaposed layers, a first layer of said two juxtaposed layers being a high-adhesion layer and a second layer of said two juxtaposed layers being a high-solderability layer, said high-adhesion layer being secured to said alumina substrate and prepared from a composition further comprising an inorganic binder, said high-solderability layer being secured to said high-adhesion layer and adjacent said solder layer, said high-solderability layer being substantially free of inorganic binder.

5. A microelectronic device as set forth in claim 4 wherein said metallic material consists of copper.

6. A microelectronic device having enhanced lateral heat dissipation characteristics, said device comprising:
an alumina substrate;
a heat generating component supported by said alumina substrate;
a first solder layer underlying said heat generating component;
a first ultra-thick thick film having a thickness ranging from about 2 to about 5 mils, said first ultra-thick thick film being disposed between said first solder layer and said alumina substrate, said first ultra-thick thick film being secured to said alumina substrate;
a second ultra-thick thick film having a thickness ranging from about 2 to about 5 mils underlying said alumina substrate; and
a second solder layer underlying said second ultra-thick thick film, and a heat sink underlying said second solder layer such that said second Solder layer adheres said second ultra-thick thick film to said heat sink;
whereby said thicknesses of said first and second ultra-thick thick films promote lateral heat dissipation from said heat generating component to said alumina substrate.

7. A microelectronic device as set forth in claim 6 wherein said heat sink comprises a copper substrate underlying said second solder layer and an aluminum backplate adhered to said copper substrate.

8. A microelectronic device as set forth in claim 6 wherein said first ultra-thick thick film comprises two juxtaposed layers, a first layer of said two juxtaposed layers of said first ultra-thick thick film being a first high-adhesion layer and a second layer of said two juxtaposed layers of said first ultra-thick thick film being a first high-solderability layer, said first high-adhesion layer being adjacent and secured to said alumina layer and prepared from a composition further comprising an inorganic binder, said first high-solderability layer being adjacent to said first solder layer and being substantially free of inorganic binder; and wherein said second ultra-thick thick film comprises two juxtaposed layers, a first layer of said two juxtaposed layers of said second ultra-thick thick film being a second high-adhesion layer and a second layer of said two juxtaposed layers of said second ultra-thick thick film being a second high-solderability layer, said second high-adhesion layer being adjacent and secured to said alumina substrate and prepared from a composition further comprising an inorganic binder, said second high-solderability layer being adjacent to said second solder layer and being substantially free of inorganic binder.

9. A microelectronic device as set forth in claim 6 wherein each of said first and second ultra-thick thick films are prepared from a material comprising copper.

10. A microelectronic device having enhanced lateral heat dissipation characteristics, said device comprising:
an alumina substrate;
an integrated circuit chip supported by said alumina substrate, said integrated circuit chip having a length and a width;
a solder layer underlying said integrated circuit chip so as to be disposed between said integrated circuit chip and said alumina substrate;
a first ultra-thick thick film disposed between said solder layer and said alumina substrate, said first ultra-thick thick film having a thickness ranging from about 2 to about 5 mils, said first ultra-thick thick film having a length and width which is greater than said length and width, respectively, of said integrated circuit chip;
a second ultra-thick thick film underlying said alumina substrate, said second ultra-thick thick film having a thickness ranging from about 2 to about 5 mils, said second ultra-thick thick film having a length and width which is greater than said length and width, respectively, of said integrated circuit chip;
a thermally conductive adhesive layer underlying said second ultra-thick thick film; and
a backplate underlying said thermally conductive adhesive layer such that said alumina substrate and said second ultra-thick thick film are adhered to said backplate said thermally conductive adhesive layer;
whereby said thicknesses of said first and second ultra-thick thick films promote lateral heat dissipation from said integrated circuit chip to said alumina substrate.

11. A microelectronic device having enhanced lateral heat dissipation characteristics, said device comprising:
an alumina substrate;
an electronic component supported by said alumina substrate;
an ultra-thick thick film having a thickness ranging from about 2 to about 5 mils, said ultra-thick thick film being secured to said alumina substrate so as to be disposed between said electronic component and said alumina substrate;
a wire having a first end thereof connected to said electronic component and having an opposite end thereof bonded to said ultra-thick thick film;

whereby said thickness of said ultra-thick thick film promotes lateral heat dissipation from said wire to said alumina substrate.

12. A microelectronic device as set forth in claim 10 wherein said thermally conductive adhesive layer has a reduced thickness portion disposed under said integrated circuit chip for improved heat transfer from said integrated circuit chip to said backplate, said thermally conductive adhesive layer has a second portion which is not under said integrated circuit chip, and said second portion is thicker than said reduced thickness portion so as to provide stress relief between said alumina substrate and said backplate.

13. A microelectronic device as set forth in claim 11 wherein said ultra-thick thick film has a thickness ranging from 2 to 3 mils.

* * * * *